United States Patent [19]
MacDonald et al.

[11] Patent Number: 6,111,778
[45] Date of Patent: Aug. 29, 2000

[54] BODY CONTACTED DYNAMIC MEMORY

[75] Inventors: Eric MacDonald, Cedar Park; Subir Mukherjee, Austin, both of Tex.

[73] Assignee: International Business Machines Corporation, Armonk, N.Y.

[21] Appl. No.: 09/307,865

[22] Filed: May 10, 1999

[51] Int. Cl.[7] .................................................. G11C 11/24
[52] U.S. Cl. .................. 365/149; 365/150; 365/185.01; 257/350
[58] Field of Search ..................................... 365/149, 150, 365/185.01; 257/350

[56] References Cited

U.S. PATENT DOCUMENTS

| | | | |
|---|---|---|---|
| 5,448,513 | 9/1995 | Hu et al. | 365/150 |
| 5,587,604 | 12/1996 | Machesney et al. | 257/350 |
| 5,821,769 | 10/1998 | Douseki | 326/24 |
| 5,825,696 | 10/1998 | Hidaka et al. | 365/189.09 |

OTHER PUBLICATIONS

Mandelman et al, Floating–Body Concerns for SOI Dynamic Random Access Memory (DRAM), Proceedings 1996 IEEE International SOI Conference, 136–137, Oct. 1996.

"Low–Voltage Transient Bipolar Effect Induced by Dynamic Floating–Body Chargin in PS/SOI MOSFETs"; Marion M. Pelella et al; Final Camera Ready Art, Oct. 1995.

*Primary Examiner*—David Nelms
*Assistant Examiner*—Connie C. Yoha
*Attorney, Agent, or Firm*—Casimer K. Salys; Felsman, Bradley, Vaden, Gunter & Dillon, LLP

[57] ABSTRACT

A dynamic memory circuit in which the inherent bipolar transistor effect within a floating body transistor is utilized to store an information bit. A floating body of a storage transistor stores an information bit in the form of an electric charge. The floating body is charged and discharged via an access transistor during data write operations. The inherent bipolar transistor resident within the floating body transistor increases the effective capacitance of the floating body which acts as the storage node, and thereby enhances the magnitude of the discharge current which represents the stored information bit during read operations.

13 Claims, 3 Drawing Sheets

BODY CONTACTED DYNAMIC MEMORY

TECHNICAL FIELD

The present invention relates in general to dynamic random access memory (DRAM) circuits, and in particular to a method and system for utilizing floating bodies within Metal Oxide Semiconductor Field Effect Transistors (MOSFETs) to store information bits. Still more particularly, the present invention relates to a method and system which capitalizes on the parasitic bipolar transistor effect within floating body contacted MOSFETs to more efficiently store and retrieve digital information within a dynamic memory array.

DESCRIPTION OF THE RELATED ART

A memory circuit is a collection of storage cells, referred to hereinafter as "bit cells", together with associated circuits needed to transfer information to or from any desired location within the memory circuit. A common type of such a memory circuit is Random Access Memory (RAM). Integrated circuit RAM units are available as one of two general types: static and dynamic. Static RAM consists essentially of internal latches that store binary information. Any information stored in this manner will remain intact as long as power is applied to the unit. The dynamic RAM or DRAM, stores the binary information in the form of electric charges that are stored in capacitors. The capacitors are typically provided inside the integrated circuit by MOS transistors. Because capacitors lose charge over time, DRAM circuits must include logic to refresh (recharge) the RAM devices continuously. While a conventional DRAM is being refreshed, it cannot be read by the processor, thus causing DRAM to be slower than static random access memory devices (SRAMs). Despite being slower, DRAMs are more common utilized than SRAMs because their circuitry is simpler and because they can hold several times as much data per unit area on an integrated circuit.

FIG. 1 depicts a conventional DRAM circuit 100 consisting of one designated storage capacitor 106 and one access transistor 104. Storage capacitor 106 and access transistor 104 combine to form a one-transistor DRAM bit cell 102 in which one bit of digital information may be stored. For conventional DRAM circuits, storage capacitor 106 would have a value of capacitance typically in the range of 30–100 fF. Within bit cell 102, binary data is stored at any given time as the presence or absence of charge in storage capacitor 106. Capacitor 108 represents the parasitic capacitance associated with a data input/output (I/O) line 110. The capacitance of capacitor 108 is typically much greater than that of individual storage capacitors in a memory array such as storage capacitor 106 and this differential plays an important role in how bit cell 102 operates.

A "data write" operation in which a "0" bit or a "1" bit is delivered into storage capacitor 106 is relatively simple. To deliver or "write" a logic "1" into bit cell 102, data I/O line 110 is raised to a logic "1" level (usually a positive value of a five or less volts) by external write circuitry (not depicted). In order to permit the logic "1" to pass from data I/O line 110 into storage capacitor 106, access transistor 104 must be enabled (switched on) during the write operation by pulling a Read/Write enable line 112 high (logic "1" if access transistor 104 is an N-type MOSFET or NFET). Storage capacitor 106 thus assumes a charge level corresponding to a logic "1" by accumulating a charge passed from data I/O line 110 through access transistor 104. A write "0" operation is similar to a write "1" except that data I/O line 110 is pulled to a logic "0" (usually a value of 0 volts), and storage capacitor 106 assumes this value by discharging through access transistor 104.

In order to read data from bit cell 102, on the other hand, a special read/refresh circuit 114 must be included into DRAM circuit 100. Read/refresh circuit 114 is necessary since a data "read" operation from bit cell 102 is necessarily a "destructive readout", meaning the data stored within storage transistor 106 is lost during a read operation. A read operation begins with parasitic capacitance of capacitor 108 being precharged to $V_{dd}$ through pre-charge pass transistor 114. Read/write enable line 112 is then pulled to a logic "1" in order to activate access transistor 104. With access transistor 104 enabled (in pass mode) node 116 is shared between storage capacitor 106 and parasitic capacitor 108 thus resulting in charge sharing and loss of the charge on the much smaller storage capacitor 106.

The result of this charge sharing is that the voltage level on node 116 will either increase or decrease slightly when the charge redistribution occurs. Due to the typically substantial value of capacitance of capacitor 108, the shift, or "dip" in voltage is very slight and must be detected and amplified into a usable signal level by a sense amplifier (not depicted). A "write back" or refresh operation must therefore be performed either by the sense amplifier or by pre-charge/refresh device such as pre-charge transistor 114 within the bit cell itself. In either case this additional circuitry consumes valuable space that is increasingly scarce in modern sub-micron technologies.

As the demand for ever more compact integrated circuit designs continues, there is the corresponding need to further reduce the size of IC components and devices such as DRAMs even further. Conventional DRAM implementations utilize capacitors to store the charge required to "remember" the state of the bit. For "read" operations, in which a request is made by address/decoder circuitry to retrieve the bit, this charge must be sufficiently large to be detected by a sense amplifier. The size of the capacitor must be correspondingly sufficient to accommodate accumulation of such a sufficient charge at the expense of bit cell area.

It would therefore be desirable to be able to enhance storage capacity of DRAM circuits while minimizing the size of needed storage elements. Further, it would be desirable to provide a sense current (charge or discharge) of greater magnitude while maintaining a memory bit cell of minimal size.

SUMMARY OF THE INVENTION

It is therefore one object of the present invention to provide an improved dynamic random access memory (DRAM) device.

It is another object of the present invention to provide a method and system for utilizing floating bodies within Metal Oxide Semiconductor Field Effect Transistors (MOSFETs) to store information bits.

It is still another object of the present invention to provide a method and system which capitalizes on the parasitic bipolar transistor effect within floating body contacted MOSFETs to more efficiently store and retrieve digital information within a dynamic memory array.

The foregoing objects are achieved as is now described. A dynamic memory circuit is disclosed in which the inherent bipolar transistor effect within a floating body transistor is used to store an information bit. A floating body stores an information bit in the form of an electric charge. The floating body is charged and discharged via an access transistor during data write operations. The inherent bipolar transistor resident within the floating body transistor increases the effective capacitance of the floating body which acts as the storage node, and thereby enhances the magnitude of the discharge current which represents the stored information bit during read operations.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

The improved dynamic RAM (DRAM) of the present invention utilizes a characteristic sometimes referred to as "bipolar leakage" or "inherent bipolar effect" within Metal Oxide Semiconductor Field-Effect Transistors (MOSFETs) which have "floating bodies". "Floating body" refers to a transistor body which is not coupled to, and is therefore insulated from, power or ground rails within an integrated circuit (IC) chip. Various levels of charge may therefore accumulate within a floating body of a transistor. As explained below with reference to the figures, floating-body transistors are a significant characteristic of transistors fabricated utilizing Silicon-On-Insulator (SOI) technology. As utilized herein, "inherent bipolar effect" refers to the inherent bipolar transistor effect that occurs when a charge differential builds between the floating body and the source of an SOI MOSFET.

Figure 1:
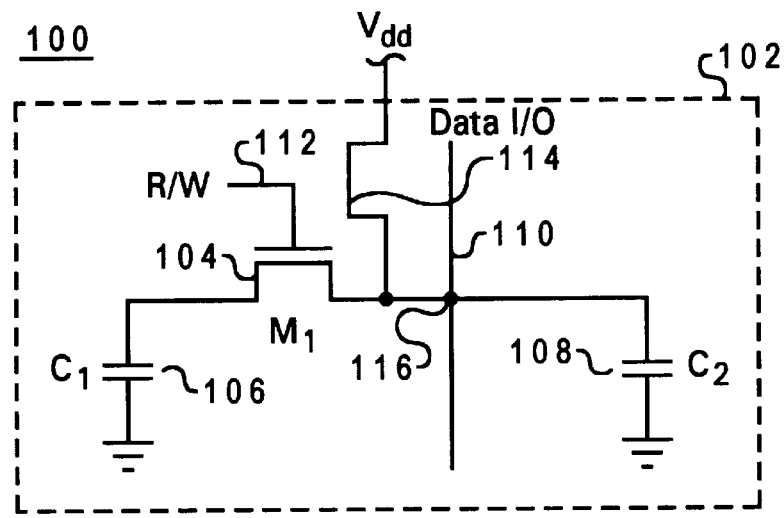
FIG. 1 depicts a schematic representation of a prior art dynamic RAM bit cell.
Figure 2:
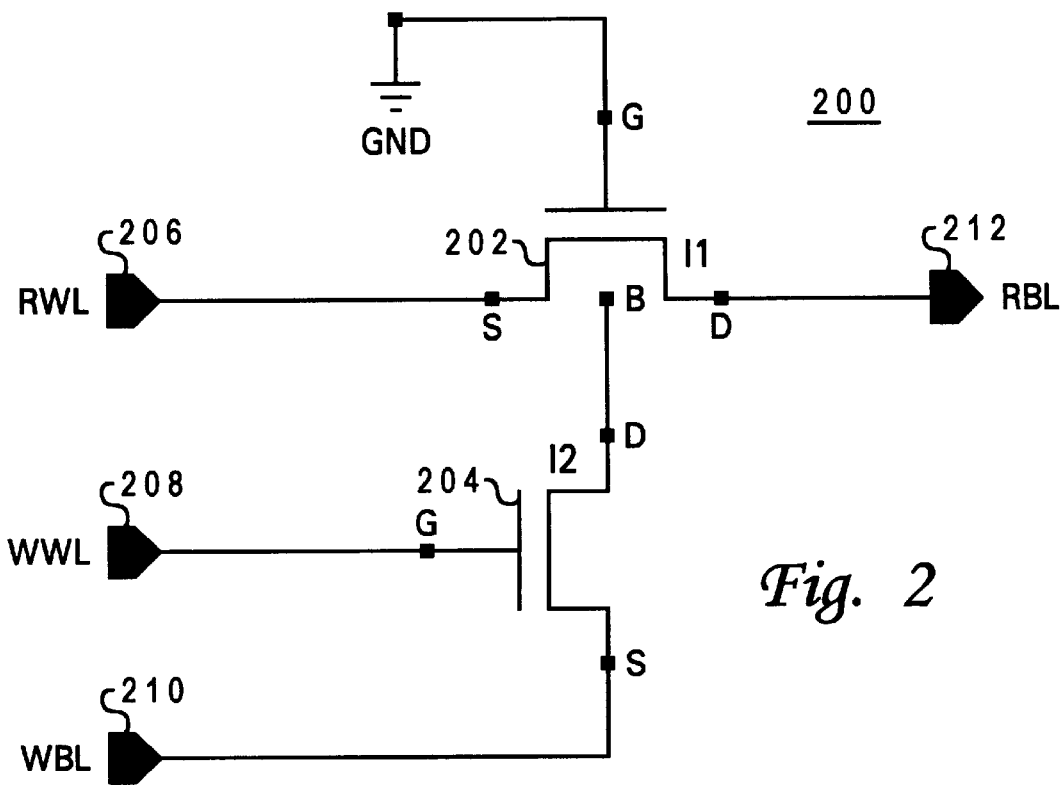
FIG. 2 illustrates a dynamic RAM bit cell with a body-contacted Silicon-On-Insulator (SOI) MOSFET utilized as the storage element in accordance with the teachings of the present invention.

With reference now to the figures and in particular with reference to FIG. 2, there is depicted a body-contacted dynamic random access memory (BCDRAM) bit cell 200 in accordance with the teachings of the present invention. Bit cell 200 includes a write access transistor 204 which is a P-type MOSFET (PFET), and a storage transistor 202, which is an N-type MOSFET (NFET).

FIG. 2 depicts one embodiment of the present invention in which bit cell 200 is comprised of two MOSFETs. It should be noted however, that alternate embodiments are possible in which different numbers of transistors, may be utilized within bit cell 200 without parting from the scope of the present invention. It is preferred, however, that at least one of the transistors within the bit cell have a body which "floats" and thus may be independently charged and discharged as necessary. Therefore, and as explained in greater detail below with reference to FIGS. 3A, 3B, and 4, a preferred embodiment of the present invention utilizes a transistor constructed utilizing Silicon On Insulator (SOI) technology as the storage node within the bit cell.

SOI is a class of integrated circuits that is currently under rapid development. A preferred embodiment of the method and system of the present invention enhances storage capacity by capitalizing on the floating-body characteristics of SOI CMOS MOSFETs. A preferred embodiment of the present invention is therefore implemented utilizing SOI technology. SOI technology places the carrier transport layer above an insulating layer on a substrate.

The carrier transport layer and transistor body are electrically isolated from the substrate. Therefore, in SOI implementations, transistor bodies are floating with respect to ground and power. A voltage supply may be coupled directly to the transistor body, and the voltage and charge level of the transistor body may thus be varied with respect to power and ground.

When storage transistor 202 contains a logic "1" (2 volts stored in the body) the body-to-source junction (PN junction) becomes forward biased. This condition will precipitate an inherent bipolar current spike whose magnitude is proportional to the charge accumulated on the body of the storage SOI MOSFET multiplied times the current gain (beta value) of the inherent bipolar transistor. In this manner the effective value of capacitance, in terms of the magnitude of discharge current sensed at Read Bit Line (RBL) 212, is enhanced by this parasitic bipolar effect.

Figure 3A:
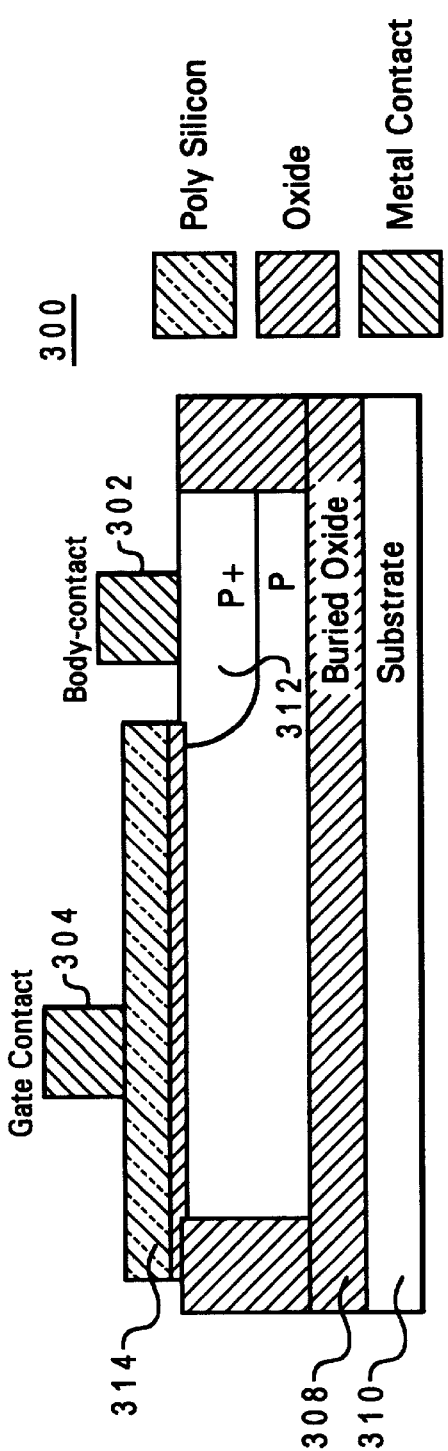
FIG. 3A depicts a cross-section view through the body and gate contact of a body-contacted SOI MOSFET that may be utilized in a preferred embodiment of the present invention.
Figure 3B:
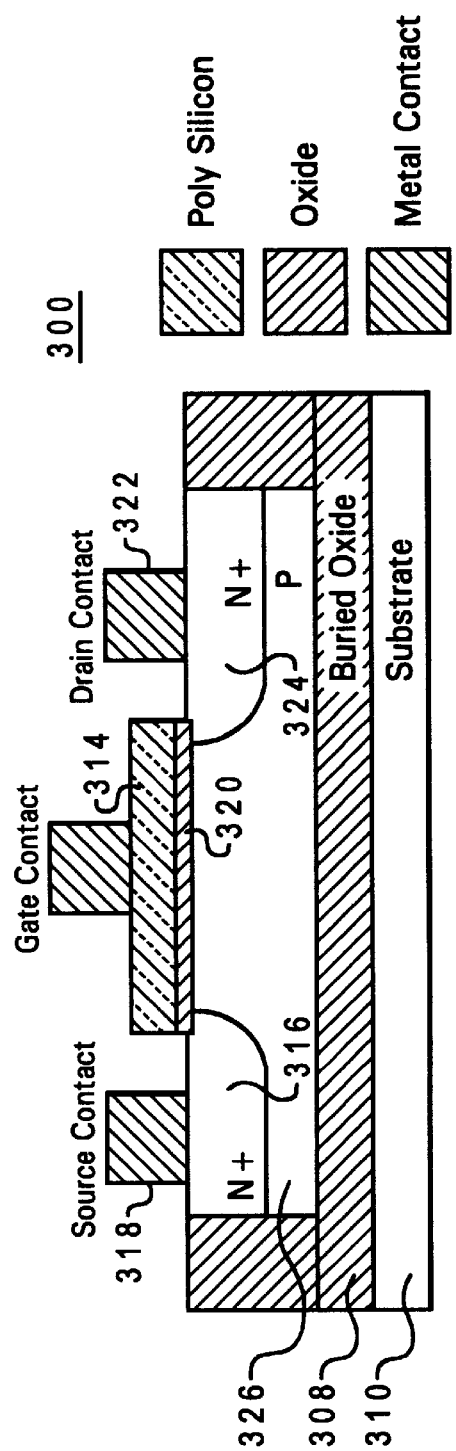
FIG. 3B illustrates a cross-section view through the source and drain contact of a body-contacted SOI MOSFET.

With reference now to FIGS. 3A and 3B, there are depicted simplified cross-section views of an exemplary body-contacted SOI NFET 300 that may be utilized in accordance with a preferred embodiment of the present invention. The simplified cross-section view through a gate contact 304 and a body contact 302, depicted in FIG. 3A, best illustrates the particular physical characteristics of SOI NFET 300 that may be advantageously utilized in a preferred embodiment of the present invention.

The cross section depiction of SOI NFET 300 includes gate contact 304, contacting gate 314, and body contact 302, contacting body 312. In accordance with one embodiment of the present invention, and as described with reference to FIG. 2, a data input source, such as the drain contact of access transistor 204, may be electrically connected to body contact 302 thereby permitting a logic "0" or "1" to be written to MOSFET body 312. As illustrated in FIG. 3A, MOSFET body 312 is electrically insulated from substrate 310 by an insulating layer 308. This insulation between the body and a common substrate is a fundamental characteristic upon which the present invention relies. It is the charge stored by MOSFET body 312 via body contact 302 that is referred to herein as "body charge". Referring now to FIG. 3B, a cross-section view through a source contact 318 and a drain contact 322 of body-contacted SOI MOSFET 300 is illustrated in accordance with the present invention. Carrier transport layer 326 is illustrated adjacent to silicon oxide layer 308. The charge differential between MOSFET body 312 (the body charge) and N diffusion 316 (the source of SOI NFET 300), is what gives rise to the inherent bipolar effect which may be utilized to enhance the effective capacitance of NFET 300.

A SOI MOSFET is manufactured by creating silicon oxide layer within substrate material 310. A widely utilized substrate material is silicon. The silicon oxide layer can be created by various methods. One method is referred to by those skilled in the art as Separation by Implantation of Oxygen (SIMOX) which is utilized to fabricate SOI CMOS. In a typical SIMOX method, oxygen is implanted in a single crystal silicon wafer by a bombardment technique which controls the depth of penetration of the silicon substrate by oxygen atoms. Silicon oxide layer 308 is formed below the thin layer of silicon (i.e. carrier transport layer 326) which has been penetrated by oxygen atoms. Alternate methods for forming an insulating layer on a silicon substrate material are of course possible without departing from the spirit or scope of the present invention.

During manufacturing, N diffusions 316 and 324 are formed within carrier transport layer 326. N diffusions 316 and 324 form the drain and source of SOI NFET 300. Doping is well known in the manufacture of transistors and will not be discussed herein. A polysilicon layer 314 is formed over surface oxide layer 320. Surface oxide layer 320 is then formed on top of carrier transport layer 326 between N wells 316 and 324.

FIG. 3A and FIG. 3B depict one illustrative structure which can operate in conformance with the present invention. However, many other embodiments utilizing other construction methods could provide an enhanced capacitance MOSFET such as SOI NFET 300. For example, the present invention is not limited to silicon structures. Silicon germanium and other compounds can provide enhanced performance for applications which have special requirements.

Returning to FIG. 2, storage transistor 202 stores an information bit in the form of an electric charge on its body. Bit cell 200 is configured such that the drain terminal of write access transistor 204 is contacted to the body contact of storage transistor 202. To read an information bit stored within bit cell 200 requires that the charge level corresponding to the stored bit on the body of storage transistor 202 be detected at Read Bit Line (RBL) 212.

In the embodiment depicted, a read operation will commence when Read Word Line (RWL) 206 enables the charge stored within storage transistor 202 to be sensed on RBL 212 as a voltage "dip" (corresponding to "read 1") or lack thereof (corresponding to a "read 0"). Assuming storage transistor 202 is an N-type SOI MOSFET, this is accomplished as follows. A RWL 206 is coupled to the source terminal of storage transistor 202 and is held at a steady-state high (approximately 2 volts) voltage level. When a "Read" operation is initiated, the voltage on RWL 206 is pulled from a high to a low (0 volts) level. If the body of storage transistor 202 has been charged by a previous write cycle, the source-body junction of storage transistor 202 will be forward biased since the body (P-type material) will be at a higher potential than the source (N-type material). The source-body junction corresponds to the emitter-base junction of the parasitic bipolar junction transistor within storage transistor 202. The result is a forward biased emitter-base junction of the inherent parasitic bipolar transistor within storage transistor 202.

The bipolar transistor will react to a forward biased emitter-base junction in accordance with well-understood bipolar transistor operating principles, meaning the charge on the body of storage transistor 202 will swiftly discharge and consequently drop the voltage level on RBL 212. In an important feature of the present invention, the amount of charge removed (felt on RBL 212) will be the amount of charge stored in the body of storage transistor 202 just prior to the read multiplied by the current gain or "beta" of the inherent bipolar transistor. The resulting dip in RBL 212 will be detected by a sense amplifier (not depicted) as a logic "1".

A high-to-low transition on RWL 206 when the body of storage transistor 202 is discharged (logic "0" written by the previous write cycle) will have no effect on RBL 212 which will remain pre-charged to $V_{dd}$ and consequently read as a logic "0".

To write to bit cell 200, a Write-Bit Line (WBL) input 210 charges or discharge the body of storage transistor 202 when a Write Word Line (WWL) 208 is asserted, thus storing a logic "1" or "0" value. A value of logic "1" (body of storage transistor 202 charged) will remain indefinitely. However, a value of logic "0" (body discharged) may need to be refreshed due to reverse bias leakage from the drain and source to the body of storage transistor 202.

The present invention is particularly useful when implemented utilizing SOI technology. However, any technology which allows bodies of transistors to be independently charged and discharged could be utilized with the present invention. In the embodiment depicted in FIG. 2, only one transistor body in the DRAM configuration acts as a storage capacitor. Alternate embodiments may include more than one floating body SOI transistor as the storage media within a single bit cell without departing from the spirit or scope of the present invention.

Figure 4:
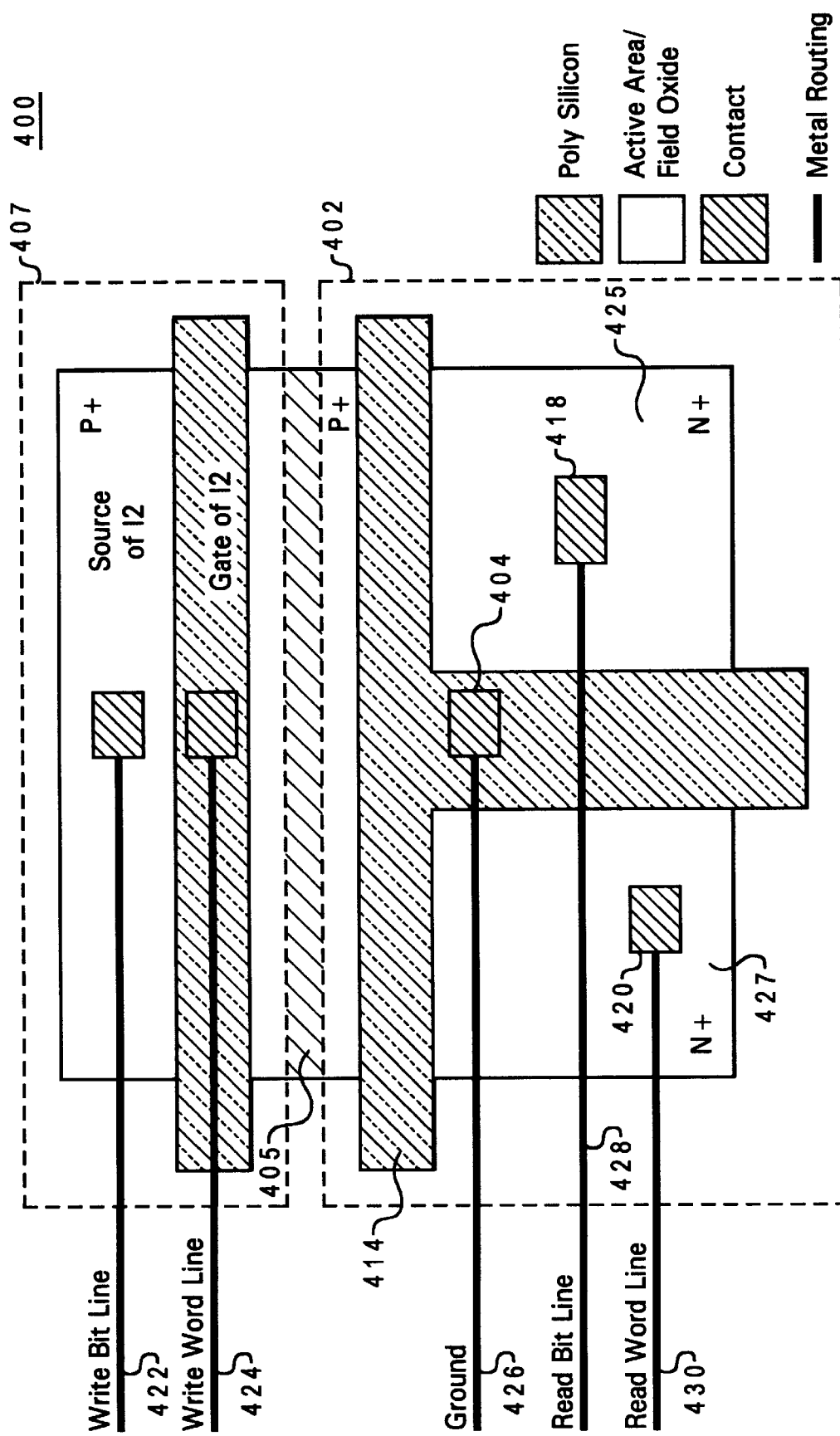
FIG. 4 depicts a top view of the body-contacted SOI MOSFET illustrated in FIGS. 3A and 3B.

With reference now to FIG. 4, a top-view of an exemplary BCDRAM bit cell 400 reveals the proximate arrangement of its functional regions and contacts. As illustrated in FIG. 4, bit cell 400 includes a storage NFET 402 and an access PFET 407. As illustrated in FIG. 4, gate contact 404, source contact 420 and drain contact 418, of storage NFET 402 are accessed by metallic conductors. Drain contact 418 is utilized to maintain contact between drain 425 and a Read Bit Line (RBL) 428. Similarly, a source contact 420 is utilized to maintain an electrical connection between source 427 and a Read Word Line (RWL) 430. Gate contact 404 is utilized to maintain an electrical connection between gate 414 and ground 426. It should be noted that the fourth contact, body contact 302 as depicted in FIG. 3A, is utilized in the exemplary embodiment of FIG. 4, to couple the floating body of storage NFET 402 with access PFET 404 at junction 405.

While the invention has been particularly shown and described with reference to a preferred embodiment, it will be understood by those skilled in the art that various changes in form and detail may be made therein without departing from the spirit and scope of the invention.

What is claimed is:

1. A dynamic memory circuit comprising:

a storage transistor having a body contacted by a body terminal, a gate terminal connected to a fixed potential, a source contacted by a source terminal, and a drain contacted by a drain terminal;

a read-word input coupled to said source terminal of said storage transistor;

a read-bit output coupled to said drain terminal of said storage transistor;

an access transistor having an access drain terminal coupled to said body terminal of said storage transistor, an access gate terminal, and an access source terminal; p1 a write-word input coupled to said access gate terminal having at least two different operating potentials; and a write-bit input coupled to said access source terminal.

2. The dynamic memory circuit of claim 1, wherein said body of said storage transistor is a floating body that stores an information bit in the form of an electric charge.

3. The dynamic memory circuit of claim 2, wherein said storage transistor is an SOI transistor.

4. The dynamic memory circuit of claim 2, wherein when said an electric charge accumulates within said body, said body functions as the base of an inherent bipolar transistor having an emitter corresponding to the source of said storage transistor, and a collector corresponding to the drain of said storage transistor, and wherein said emitter and said base form an emitter-base junction.

5. The dynamic memory circuit of claim 4, wherein said inherent bipolar transistor releases a discharge current on said read-bit output when said emitter-base junction is forward biased.

6. The dynamic memory circuit of claim 5, wherein said inherent bipolar transistor has a current gain equal to beta, and wherein the magnitude of said discharge current is proportional to the product of said stored electric charge multiplied by beta.

7. A dynamic memory cell comprising:
a storage silicon-on-insulator (SOI) field-effect transistor (FET) including:
an N-type source terminal;
an N-type drain terminal;
a P-type floating body contacting the N-type source terminal and the N-type drain terminal contact, wherein the P-type floating body stores an information bit, and wherein said P-type floating body comprises the base of an inherent bipolar transistor having an emitter that corresponds to said N-type source terminal, and a collector that corresponds to said N-type drain terminal, such that the P-type floating body and N-type source terminal form a PN junction that is biased in accordance with voltage differential between said RWL and the floating body charge;
a read word line (RWL) signal coupled to the N-type source terminal for accessing the information bit; and
a read bit line (RBL) signal coupled from the N-type drain terminal for detecting the information bit in response said RWL signal being applied to the N-type source terminal.

8. The dynamic memory cell of claim 7, wherein said P-type floating body stores an information bit in the form of a floating body charge.

9. The dynamic memory cell of claim 7, wherein said information bit is represented by a positive charge accumulation within said P-type floating body, and wherein said inherent bipolar transistor delivers said information bit onto said RBL by discharging said floating body through said N-type source terminal in response to a shifting logic level on said RWL that results in the PN junction formed by the P-type floating body and N-type source terminal becoming forward biased.

10. The dynamic memory cell of claim 9, wherein said discharging of said floating body through said N-type source terminal features a read current at said RBL that is proportional to the current gain of said inherent bipolar transistor multiplied by said floating body charge.

11. The dynamic memory cell of claim 7, further comprising a write access transistor having a terminal coupled to said floating body of said storage SOI FET, such that said information bit may be delivered from said access transistor to said storage transistor from which said information bit may be retrieved.

12. The dynamic memory cell of claim 7, further comprising a body contact for providing electrical access to said floating body of said storage SOI FET.

13. The dynamic memory cell of claim 7, wherein said storage SOI FET is a MOSFET transistor.

* * * * *